(12) United States Patent
Costa et al.

(10) Patent No.: US 10,773,952 B2
(45) Date of Patent: Sep. 15, 2020

(54) WAFER-LEVEL PACKAGE WITH ENHANCED PERFORMANCE

(71) Applicant: Qorvo US, Inc., Greensboro, NC (US)

(72) Inventors: Julio C. Costa, Oak Ridge, NC (US); Jon Chadwick, Greensboro, NC (US); David Jandzinski, Summerfield, NC (US); Merrill Albert Hatcher, Jr., Greensboro, NC (US); Jonathan Hale Hammond, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/601,858

(22) Filed: May 22, 2017

(65) Prior Publication Data

US 2017/0334710 A1    Nov. 23, 2017

Related U.S. Application Data

(60) Provisional application No. 62/339,322, filed on May 20, 2016.

(51) Int. Cl.
*B81C 1/00* (2006.01)
*H01L 23/31* (2006.01)
(Continued)

(52) U.S. Cl.
CPC ........ *B81C 1/0023* (2013.01); *H01L 23/3135* (2013.01); *H01L 23/5389* (2013.01);
(Continued)

(58) Field of Classification Search
USPC .............. 257/414, 417, 418, 419, E21.515
See application file for complete search history.

(56) References Cited

U.S. PATENT DOCUMENTS

| 4,093,562 A | 6/1978 | Kishimoto |
|---|---|---|
| 4,366,202 A | 12/1982 | Borovsky |

(Continued)

FOREIGN PATENT DOCUMENTS

| CN | 103811474 A | 5/2014 |
|---|---|---|
| CN | 103872012 A | 6/2014 |

(Continued)

OTHER PUBLICATIONS

Notice of Allowance for U.S. Appl. No. 15/287,273, dated Jun. 30, 2017, 8 pages.

(Continued)

*Primary Examiner* — Bo B Jang
(74) *Attorney, Agent, or Firm* — Withrow & Terranova, P.L.L.C.

(57) ABSTRACT

The present disclosure relates to a wafer-level package that includes a first thinned die having a first device layer, a multilayer redistribution structure, a first mold compound, and a second mold compound. The multilayer redistribution structure includes redistribution interconnects that connect the first device layer to package contacts on a bottom surface of the multilayer redistribution structure. Herein, the connections between the redistribution interconnects and the first device layer are solder-free. The first mold compound resides over the multilayer redistribution structure and around the first thinned die, and extends beyond a top surface of the first thinned die to define an opening within the first mold compound and over the first thinned die. The second mold compound fills the opening and is in contact with the top surface of the first thinned die.

22 Claims, 13 Drawing Sheets

(51) Int. Cl.
*H01L 23/538* (2006.01)
*H01L 23/00* (2006.01)
*H01L 21/56* (2006.01)

(52) U.S. Cl.
CPC .............. *H01L 24/19* (2013.01); *H01L 24/96* (2013.01); *H01L 21/568* (2013.01); *H01L 2224/04105* (2013.01); *H01L 2224/12105* (2013.01); *H01L 2224/24137* (2013.01); *H01L 2224/32225* (2013.01); *H01L 2224/73267* (2013.01); *H01L 2224/96* (2013.01); *H01L 2924/18162* (2013.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzgerald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |

(56) References Cited

U.S. PATENT DOCUMENTS

| | | |
|---|---|---|
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1* | 4/2012 | Lin .................. B81C 1/00333 257/414 |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1* | 2/2013 | Meyer ................ H01L 23/3107 257/773 |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1* | 12/2016 | Chang .................. H04R 19/005 |
| 2017/0024503 A1 | 1/2017 | Connelly |
| 2017/0033026 A1 | 2/2017 | Ho et al. |
| 2017/0053938 A1 | 2/2017 | Whitefield |
| 2017/0190572 A1 | 7/2017 | Pan et al. |
| 2017/0200648 A1 | 7/2017 | Lee et al. |
| 2017/0263539 A1 | 9/2017 | Gowda et al. |
| 2018/0269188 A1 | 9/2018 | Yu et al. |
| 2019/0043812 A1 | 2/2019 | Leobandung |
| 2019/0172842 A1 | 6/2019 | Whitefield |
| 2019/0189599 A1 | 6/2019 | Baloglu et al. |
| 2019/0287953 A1 | 9/2019 | Moon et al. |
| 2019/0304910 A1 | 10/2019 | Fillion |
| 2020/0058541 A1 | 2/2020 | Konishi et al. |

FOREIGN PATENT DOCUMENTS

| | | |
|---|---|---|
| EP | 2996143 A1 | 3/2016 |
| JP | S505733 Y1 | 2/1975 |
| JP | H11220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |
| WO | 2018083961 A1 | 5/2018 |
| WO | 2018125242 A1 | 7/2018 |

OTHER PUBLICATIONS

Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.

(56) References Cited

OTHER PUBLICATIONS

Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/491,064, dated Jan. 2, 2018, 9 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.

(56) References Cited

OTHER PUBLICATIONS matweb.com/search/DataSheet.aspx?MatGUID= 3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application= Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid= 89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and SI-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.

(56) References Cited

OTHER PUBLICATIONS

Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Non-Final Office Action for U.S. Appl. No. 15/652,867, dated Oct. 10, 2017, 5 pages.
Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Notice of Allowance for U.S. Appl. No. 15/695,629, dated Jul. 11, 2018, 12 pages.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Notice of Allowance for U.S. Appl. No. 15/676,693, dated Jul. 20, 2018, 8 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
First Office Action for Chinese Patent Application No. 201510746323.X, dated Nov. 2, 2018, 12 pages.
Notice of Allowance for U.S. Appl. No. 16/038,879, dated Jan. 9, 2019, 8 pages.
Non-Final Office Action for U.S. Appl. No. 15/945,418, dated Nov. 1, 2018, 13 pages.
Notice of Allowance for U.S. Appl. No. 16/004,961, dated Jan. 11, 2019, 8 pages.
Non-Final Office Action for U.S. Appl. No. 15/695,579, dated Jan. 28, 2019, 8 pages.
Notice of Allowance for U.S. Appl. No. 15/695,579, dated Mar. 20, 2019, 8 pages.
Non-Final Office Action for U.S. Appl. No. 15/992,613, dated Feb. 27, 2019, 15 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Notice of Allowance for U.S. Appl. No. 16/004,961, dated May 13, 2019, 8 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
Tsai, Szu-Ping., et al., "Performance Enhancement of Flip-Chip Packaged AlGaAN/GaN HEMTs by Strain Engineering Design," IEEE Transcations on Electron Devices, vol. 63, Issue 10, Oct. 2016, pp. 3876-3881.
Tsai, Chun-Lin, et al., "Smart GaN platform; Performance & Challenges," IEEE International Electron Devices Meeting, 2017, 4 pages.
Notice of Reasons for Refusal for Japanese Patent Application No. 2015-180657, dated Jul. 9, 2019, 4 pages.
Advisory Action for U.S. Appl. No. 15/992,613, dated Jul. 29, 2019, 3 pages.
Notice of Allowance for U.S. Appl. No. 15/975,230, dated Jul. 22, 2019, 7 pages.
Final Office Action for U.S. Appl. No. 15/873,152, dated Aug. 8, 2019, 13 pages.
Notice of Allowance for U.S. Appl. No. 16/004,961, dated Aug. 28, 2019, 8 pages.
International Search Report and Written Opinion for International Patent Application No. PCT/US19/25591, dated Jun. 21, 2019, 7 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.

(56) References Cited

OTHER PUBLICATIONS

Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/873,152, dated Dec. 10, 2019, 9 pages.
Non-Final Office Action for U.S. Appl. No. 16/527,702, dated Jan. 10, 2020, 10 pages.
Office Action for Japanese Patent Application No. 2018-526613, dated Nov. 5, 2019, 8 pages.
Final Office Action for U.S. Appl. No. 16/204,214, dated Mar. 6, 2020, 14 pages.
Corrected Notice of Allowability for U.S. Appl. No. 15/695,579, dated Feb. 5, 2020, 5 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Intention to Grant for European Patent Application No. 17757646.9, dated Feb. 27, 2020, 55 pages.
Decision of Rejection for Japanese Patent Application No. 2015-180657, dated Mar. 17, 2020, 4 pages.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Advisory Action for U.S. Appl. No. 16/204,214, dated Apr. 15, 2020, 3 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowance for U.S. Appl. No. 16/004,961, dated Apr. 30, 2020, 8 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
International Search Report and Written Opinion for International Patent Application No. PCT/US2020/014665, dated May 13, 2020, 17 pages.
International Search Report and Written Opinion for International Patent Application No. PCT/US2020/014667, dated May 18, 2020, 14 pages.
Examination Report for European Patent Application No. 16751791.1, dated Apr. 30, 2020, 15 pages.
Notification of Reasons for Refusal for Japanese Patent Application No. 2018-526613, dated May 11, 2020, 5 pages.
Quayle Action for U.S. Appl. No. 16/703,251, dated Jun. 26, 2020, 5 pages.
Notice of Allowability for U.S. Appl. No. 15/695,579, dated Jun. 25, 2020, 4 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014666, dated Jun. 4, 2020, 18 pages.
International Search Report and Written Opinion for International Patent Application No. PCT/US2020/014669, dated Jun. 4, 2020, 15 pages.

\* cited by examiner

WAFER-LEVEL PACKAGE WITH ENHANCED PERFORMANCE

RELATED APPLICATIONS

This application claims the benefit of provisional patent application Ser. No. 62/339,322, filed May 20, 2016, the disclosure of which is hereby incorporated herein by reference in its entirety.

FIELD OF THE DISCLOSURE

The present disclosure relates to a wafer-level package and a process for making the same, and more particularly to a wafer-level package with enhanced thermal and electrical performance, and a packaging process to enhance thermal and electrical performance of a wafer-level package.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

In addition, high speed and high performance transistors are more densely integrated in RF devices. Consequently, the amount of heat generated by the RF devices will increase significantly due to the large number of transistors integrated in the RF devices, the large amount of power passing through the transistors, and the high operation speed of the transistors. Accordingly, it is desirable to package the RF devices in a configuration for better heat dissipation.

Wafer-level fan-out (WLFO) packaging technology and embedded wafer-level ball grid array (EWLB) technology currently attract substantial attention in portable RF applications. WLFO and EWLB technologies are designed to provide high density input/output ports (I/O) without increasing the size of a package. This capability allows for densely packaging the RF devices within a single wafer.

To accommodate the increased heat generation of the RF devices, to reduce deleterious harmonic distortion of the RF devices, and to utilize advantages of WLFO/EWLB packaging technologies, it is therefore an object of the present disclosure to provide an improved package design with enhanced thermal and electrical performance. Further, there is also a need to enhance the performance of the RF devices without increasing the package size.

SUMMARY

The present disclosure relates to a wafer-level package with enhanced thermal and electrical performance, and a packaging process to enhance thermal and electrical performance of a wafer-level package. The disclosed wafer-level package includes a first thinned die, a multilayer redistribution structure, a first mold compound, and a second mold compound. The first thinned die includes a first device layer and a first dielectric layer over the first device layer. Herein, the first device layer includes a number of first die contacts at a bottom surface of the first device layer. The multilayer redistribution structure includes a number of package contacts on a bottom surface of the multilayer redistribution structure and redistribution interconnects that connect the first die contacts to certain ones of the package contacts. The multilayer redistribution structure is free of glass fiber and connections between the redistribution interconnects and the first die contacts are solder-free. In addition, the first mold compound resides over the multilayer redistribution structure and around the first thinned die, and extends beyond a top surface of the first thinned die to define an opening within the first mold compound and over the first thinned die. The top surface of the first thinned die is exposed at a bottom of the opening. The second mold compound fills the opening and is in contact with the top surface of the first thinned die.

In one embodiment of the wafer-level package, the first thinned die provides a microelectromechanical systems (MEMS) component.

In one embodiment of the wafer-level package, the first thinned die is formed from a silicon-on-insulator (SOI) structure. The first device layer of the first thinned die is formed from a silicon epitaxy layer of the SOI structure, and the first dielectric layer of the first thinned die is a buried oxide layer of the SOI structure.

According to another embodiment, the wafer-level package further includes a second intact die residing over the multilayer redistribution structure. Herein, the second intact die has a second device layer and an intact silicon substrate over the second device layer, and the first mold compound encapsulates the second intact die.

According to another embodiment, the wafer-level package further includes a third thinned die residing over the multilayer redistribution structure. Herein, the third thinned die has a third device layer and a second dielectric layer over the third device layer. The first mold compound extends beyond a top surface of the third thinned die to define a second opening within the first mold compound and over the third thinned die. The top surface of the third thinned die is exposed at a bottom of the second opening. The second mold compound fills the second opening and in contact with the top surface of the third thinned die.

In one embodiment of the wafer-level package, the first thinned die provides a MEMS component, the second intact die provides a complementary metal-oxide-semiconductor (CMOS) controller that controls the MEMS component, and the third thinned die is formed from a SOI structure. Herein, the third device layer of the third thinned die is formed from a silicon epitaxy layer of the SOI structure, and the second dielectric layer of the third thinned die is a buried oxide layer of the SOI structure.

In one embodiment of the wafer-level package, the second mold compound has a thermal conductivity greater than 2 W/m·K.

In one embodiment of the wafer-level package, the second mold compound has a thermal conductivity greater than 10 W/m·K.

In one embodiment of the wafer-level package, the second mold compound has an electrical resistivity greater that 1E6 Ohm-cm.

In one embodiment of the wafer-level package, the first mold compound and the second mold compound are formed from different materials.

In one embodiment of the wafer-level package, the first mold compound is formed from a same material as the second mold compound.

In one embodiment of the wafer-level package, the first mold compound is formed from a different material from the second mold compound.

In one embodiment of the wafer-level package, the bottom surface of the first device layer is in contact with the multilayer redistribution structure, and the first die contacts are directly connected to the redistribution interconnects.

In one embodiment of the wafer-level package, the first thinned die further includes a number of first pillars. Each of the first pillars extends from the first device layer to the multilayer redistribution structure and couples one of the first die contacts to a corresponding redistribution interconnect.

According to another embodiment, the wafer-level package further includes an underfilling layer that resides between the multilayer redistribution structure and the first mold compound, and underfills the first thinned die to encapsulate the first pillars.

In one embodiment of the wafer-level package, the underfilling layer is formed from a same material as the first mold compound.

In one embodiment of the wafer-level package, the top surface of the first thinned die exposed at the bottom of the opening is a top surface of the first dielectric layer.

In one embodiment of the wafer-level package, the first dielectric layer is formed from one of a group consisting of silicon oxide, silicon nitride, and aluminum nitride.

According to an exemplary process, a mold wafer having a first die and a first mold compound is provided. Herein, the first die includes a first device layer, a first dielectric layer over the first device layer, and a first silicon substrate over the first dielectric layer. The first device layer includes a number of first die contacts at a bottom surface of the first device layer. The first mold compound encapsulates sides of the first die such that the bottom surface of the first device layer and a top surface of the first silicon substrate are exposed. Next, a multilayer redistribution structure is formed underneath the mold wafer. The multilayer redistribution structure includes a number of package contacts on a bottom surface of the multilayer redistribution structure and redistribution interconnects that connect the first die contacts to certain ones of the package contacts. The multilayer redistribution structure is free of glass fiber and connections between the redistribution interconnects and the first die contacts are solder-free. The first silicon substrate of the first die is then removed substantially to provide a first thinned die and form a first opening within the first mold compound and over the first thinned die. A top surface of the first thinned die is exposed at a bottom of the opening. Lastly, a second mold compound is applied to substantially fill the opening and directly contact the top surface of the first thinned die.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
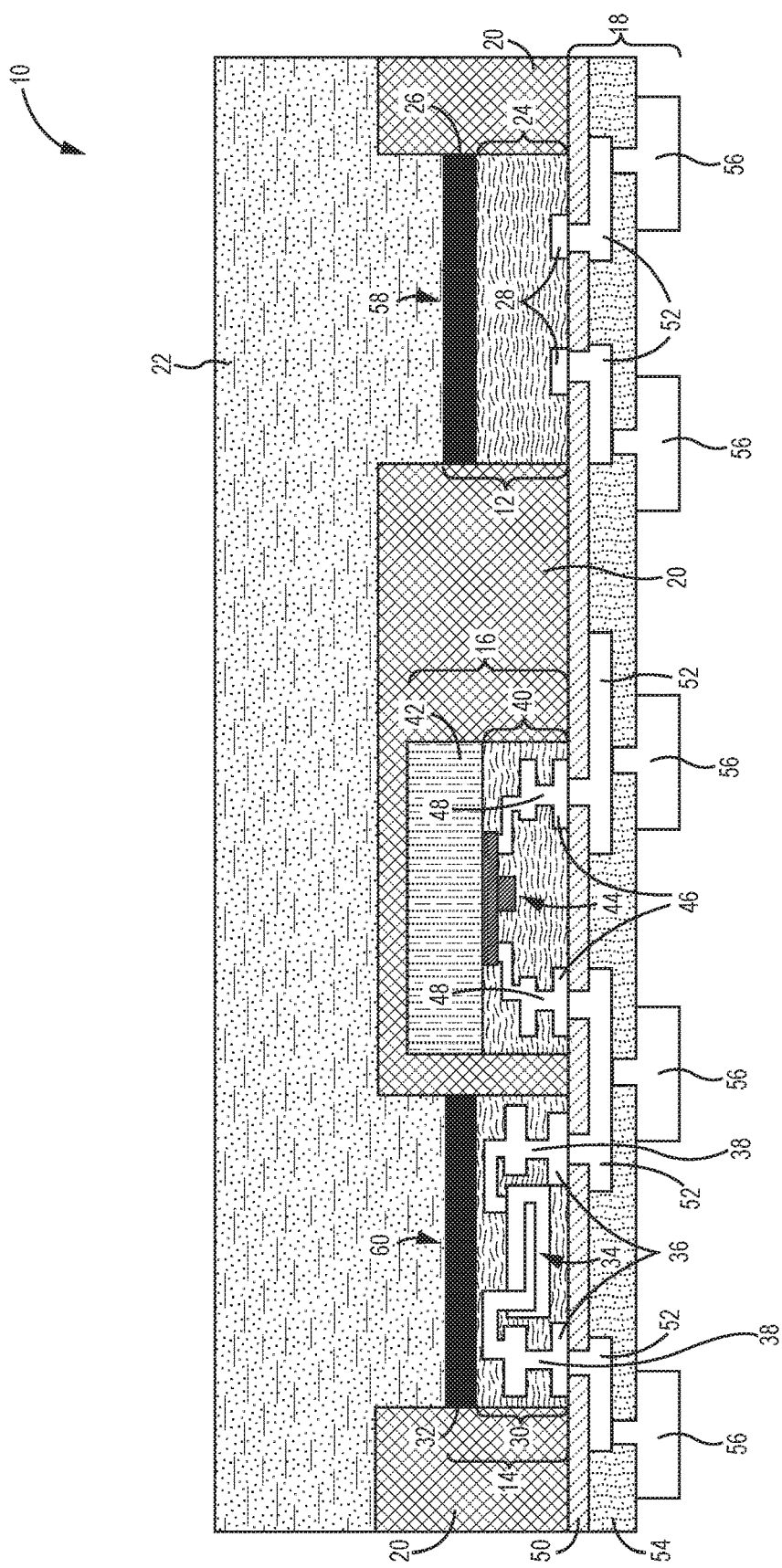
FIG. 1 shows an exemplary wafer-level package with enhanced thermal and electrical performance according to one embodiment of the present disclosure.

FIGS. 3-14 provide exemplary steps that illustrate a process to fabricate the exemplary wafer-level package shown in FIG. 1.

It will be understood that for clear illustrations, FIGS. 1-14 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a wafer-level package with enhanced thermal and electrical performance, and a packaging process to enhance thermal and electrical performance of a wafer-level package. FIG. 1 shows an exemplary wafer-level package 10 according to one embodiment of the present disclosure. For the purpose of this illustration, the exemplary wafer-level package 10 includes a thinned silicon-on-insulator (SOI) die 12, a thinned microelectromechanical systems (MEMS) die 14, a complementary metal-oxide-semiconductor (CMOS) controller die 16, a multilayer redistribution structure 18, a first mold compound 20, and a second mold compound 22. In different applications, the wafer-level package 10 may include fewer or more thinned MEMS/SOI dies and may include other dies, such as: thinned integrated passive device dies (not shown). For instance, in some applications, the wafer-level package 10 may only include thinned MEMS dies and CMOS controller dies; and in some applications, the wafer-level package 10 may only include thinned SOI dies.

In detail, the thinned SOI die 12 includes a first device layer 24 and a first dielectric layer 26 over a top surface of the first device layer 24. The first device layer 24 includes a number of first die contacts 28 at a bottom surface of the first device layer 24. Herein, the thinned SOI die 12 is formed from an SOI structure, which refers to a structure including a silicon substrate, a silicon epitaxy layer, and a buried oxide layer sandwiched between the silicon substrate and the silicon epitaxy layer. The first device layer 24 of the thinned SOI die 12 is formed by integrating electronic components (not shown) in or on the silicon epitaxy layer of the SOI structure. The first dielectric layer 26 of the thinned SOI die 12 is the buried oxide (BOX) layer of the SOI structure. In addition, the silicon substrate of the SOI structure is removed substantially to complete the thinned SOI die 12 (more details in the following discussion). The first device layer 24 has a thickness between 0.1 μm and 50 μm, and the first dielectric layer 26 has a thickness between 10 nm and 1000 nm.

The thinned MEMS die 14 includes a second device layer 30 and a second dielectric layer 32 over a top surface of the second device layer 30. The second device layer 30 includes a MEMS component 34 that is typically a switch, a number of second die contacts 36 at a bottom surface of the second device layer 30, and MEMS via-structures 38 extending from the MEMS component 34 to the second die contacts 36. Herein, the second device layer 30 may include a cavity, within which the MEMS component 34 is free to actuate. The second device layer 30 has a thickness between 0.5 μm and 100 μm, and may be formed from a combination of dielectric and metal layers (such as oxide, nitride, aluminum, titanium, copper, or the like). The second dielectric layer 32 has a thickness between 10 nm and 5000 nm, and may be formed from silicon oxide, silicon nitride, or aluminum nitride.

Notice that the thinned SOI die 12 and the thinned MEMS die 14 are both thinned dies, which have a device layer, a dielectric layer over the device layer, and essentially no silicon substrate over the dielectric layer. Herein, essentially no silicon substrate over the dielectric layer refers to at most 2 μm silicon substrate over the dielectric layer. In desired cases, each thinned die does not include any silicon substrate over the dielectric layer such that a top surface of each thinned die is a top surface of the dielectric layer. For other cases, the top surface of one thinned die may be a top surface of the thin silicon substrate.

The CMOS controller die 16 includes a third device layer 40 and a silicon substrate 42 over the third device layer 40. The third device layer 40 includes a CMOS controller 44 that controls the MEMS component 34 within the thinned MEMS die 14, a number of third die contacts 46 at a bottom surface of the third device layer 40, and controller via-structures 48 extending from the CMOS controller 44 to the third die contacts 46. The third device layer 40 has a thickness between 0.5 μm and 20 μm, and may be formed from a combination of dielectric and metal layers (such as oxide, nitride, aluminum, titanium, copper, or the like). The CMOS controller die 16 is an intact die, which includes an intact silicon substrate with a thickness between 50 μm and 250 μm or between 50 μm and 750 μm.

Herein, the multilayer redistribution structure 18 includes a first dielectric pattern 50 at the top, a number of redistribution interconnects 52, a second dielectric pattern 54, and a number of package contacts 56. In one embodiment, the thinned SOI die 12, the thinned MEMS die 14, and the CMOS controller die 16 reside directly over the multilayer redistribution structure 18. As such, the first device layer 24 of the thinned SOI die 12, the second device layer 30 of the thinned MEMS die 14, and the third device layer 40 of the CMOS controller die 16 are in contact with the first dielectric pattern 50. In addition, the first die contacts 28 at the bottom surface of the first device layer 24, the second die contacts 36 at the bottom surface of the second device layer 30, and the third die contacts 46 at the bottom surface of the third device layer 40 are exposed through the first dielectric pattern 50. The redistribution interconnects 52 are electrically coupled to the first, second, and third die contacts 28, 36, and 46 through the first dielectric pattern 50 and extend underneath the first dielectric pattern 50. The connections between the redistribution interconnects 52 and the first, second, and third die contacts 28, 36, and 46 are solder-free.

The second dielectric pattern 54 is formed underneath the first dielectric pattern 50 to partially encapsulate each redistribution interconnect 52. As such, a portion of each redistribution interconnect 52 is exposed through the second dielectric pattern 54. In different applications, there may be extra redistribution interconnects (not shown) electronically coupled to the redistribution interconnects 52 through the second dielectric pattern 54, and an extra dielectric pattern (not shown) formed underneath the second dielectric pattern 54 to partially encapsulate the extra redistribution interconnects.

In this embodiment, each package contact 56 is electronically coupled to a corresponding redistribution interconnect 52 through the second dielectric pattern 54. Consequently, the redistribution interconnects 52 connect certain ones of the first, second, and third die contacts 28, 36, and 46 to certain ones of the package contacts 56 on a bottom surface of the multilayer redistribution structure 18.

The multilayer redistribution structure 18 may be free of glass fiber or glass-free. Herein, the glass fiber refers to individual glass strands twisted to become a larger grouping. These glass strands may be then woven into a fabric. The first dielectric pattern 50 and the second dielectric pattern 54 may be formed of benzocyclobutene (BCB) or polyimide. The redistribution interconnects 52 may be formed of copper or other suitable metals. The package contacts 56 may be bump contacts formed of solder alloys, such as tin or tin alloys, or may be land grid arrays (LGA) contacts. A combination of the first dielectric pattern 50, the redistribution interconnects 52, and the second dielectric pattern 54 has a thickness between 2 μm and 300 μm.

The first mold compound 20 resides over a top surface of the multilayer redistribution structure 18, resides around the thinned SOI die 12 and the thinned MEMS die 14, and encapsulates the CMOS controller die 16.

Further, the first mold compound 20 extends beyond a top surface of the thinned SOI die 12 to define a first opening 58 within the first mold compound 20 and over the thinned SOI die 12, and extends beyond a top surface of the thinned MEMS die 14 to define a second opening 60 within the first mold compound 20 and over the thinned MEMS die 14. Herein, the top surface of the thinned SOI die 12 is exposed at a bottom of the first opening 58, and the top surface of the thinned MEMS die 14 is exposed at a bottom of the second opening 60.

The second mold compound 22 substantially fills the first and second openings 58 and 60, and is in contact with the top surface of the thinned SOI die 12 and the top surface of the thinned MEMS die 14. The second mold compound 22 has a thermal conductivity greater than 2 W/m·K or greater than 10 W/m·K, and has an electrical resistivity greater than 1E6 Ohm-cm. In general, the higher the thermal conductivity of the second mold compound 22, the better the thermal performance of the thinned SOI die 12 and the thinned MEMS die 14. Further, the high electrical resistivity of the second mold compound 22 may improve the quality factor (Q) at high frequencies of the MEMS component 34 of the thinned MEMS die 14.

The second mold compound 22 may be formed of thermoplastics or thermoset materials, such as PPS (poly phenyl sulfide), overmold epoxies doped with boron nitride or alumina thermal additives, or the like. The second mold compound 22 may be formed of the same or different material as the first mold compound 20. However, unlike the second mold compound 22, the first mold compound 20 does not have thermal conductivity or electrical resistivity requirements. In some applications, both the first mold compound 20 and the second mold compound 22 have a thermal conductivity greater than 2 W/m·K. In some applications, the first mold compound 20 has a thermal conductivity less than 2 W/m·K and the second mold compound 22 has a thermal conductivity greater than 2 W/m·K. In some applications, the first mold compound 20 has a thermal conductivity greater than 2 W/m·K and the second mold compound 22 has a thermal conductivity greater than 10 W/m·K. Herein, a portion of the second mold compound 22 may reside over a top surface of the first mold compound 20. Notice that the second mold compound 22 is separate from the CMOS controller die 16 by the first mold compound 20. A top surface of the CMOS controller die 16 is in contact with the first mold compound 20.

Figure 2:
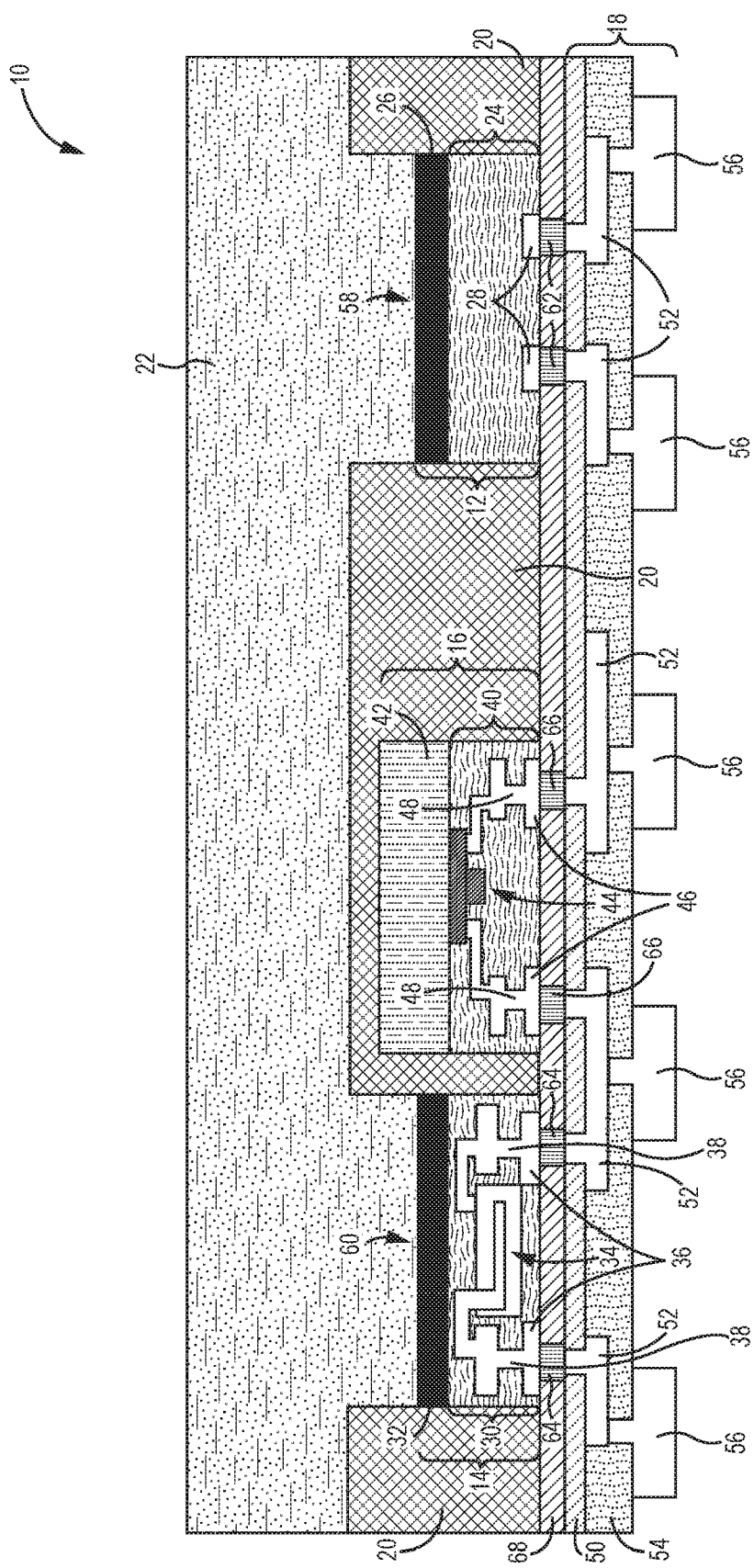
FIG. 2 shows an alternative wafer-level package with enhanced thermal and electrical performance according to one embodiment of the present disclosure.

In another embodiment, the thinned SOI die 12, the thinned MEMS die 14, and the CMOS controller die 16 are connected to the multilayer redistribution structure 18 through a number of pillars as illustrated in FIG. 2. The thinned SOI die 12 further includes first pillars 62 that extend from the first device layer 24 to the multilayer redistribution structure 18 and couple the first die contacts 28 to the corresponding redistribution interconnects 52. The thinned MEMS die 14 further includes second pillars 64 that extend from the second device layer 30 to the multilayer redistribution structure 18 and couple the second die contacts 36 to the corresponding redistribution interconnects 52. The CMOS controller die 16 further includes third pillars 66 that extend from the third device layer 40 to the multilayer redistribution structure 18 and couple the third die contacts 46 to the corresponding redistribution interconnects 52. Since the first, second and third pillars 62, 64, and 66 are formed from electrically conductive materials, such as copper, the first, second, and third die contacts 28, 36, and 46 are still electrically coupled to corresponding package contacts 56.

In some applications, the wafer-level package 10 may further include an underfilling layer 68 to encapsulate the first, second, and third pillars 62, 64, and 66. The underfilling layer 68 resides between the top surface of the multilayer redistribution structure 18 and the first mold compound 20, and underfills the thinned SOI die 12, the thinned MEMS die 14, and the CMOS controller die 16. The underfilling layer 68 may be formed from the same or different material as the first mold compound 20. In some applications, the first mold compound 20 and the underfilling layer 68 may have a thermal conductivity greater than 2 W/m·K.

FIGS. 3-14 provide exemplary steps to fabricate the exemplary wafer-level package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-14.

Figure 3:
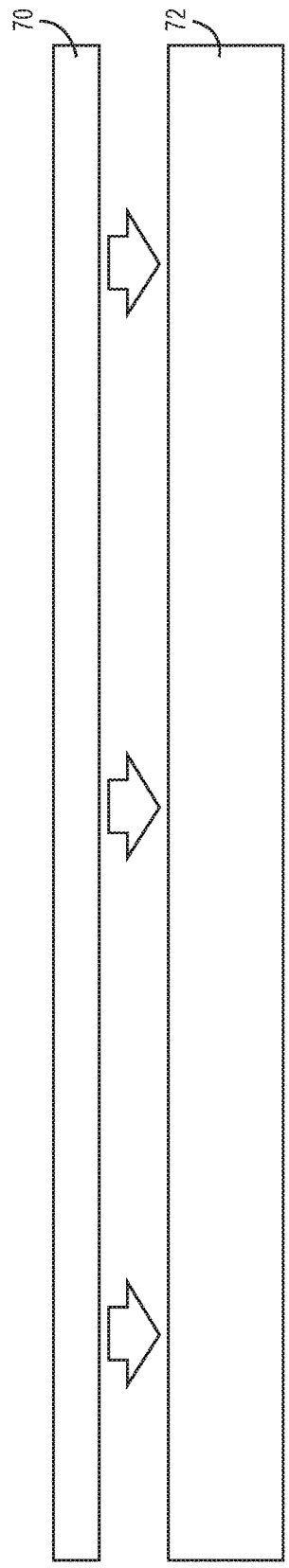
Figure 4:
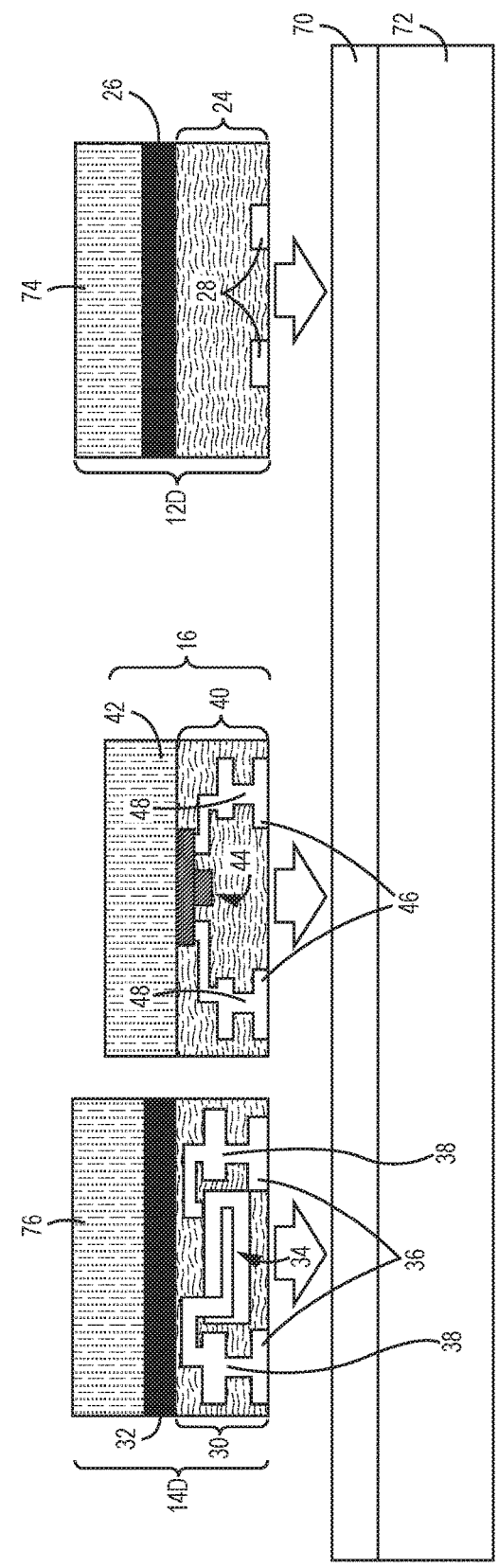

Initially, an adhesive layer 70 is applied on a top surface of a carrier 72 as illustrated in FIG. 3. Then, an SOI die 12D, a MEMS die 14D, and the CMOS controller die 16 are attached to the adhesive layer 70 as illustrated in FIG. 4. In different applications, there might be fewer or more dies attached to the adhesive layer 70. For instance, in some applications, there may be only the SOI die 12D attached to the adhesive layer 70; and in some applications, there may be only the MEMS die 14D and the CMOS controller die 16 attached to the adhesive layer 70.

For the purpose of this illustration, the SOI die 12D includes the first device layer 24, the first dielectric layer 26 over the top surface of the first device layer 24, and a first silicon substrate 74 over the first dielectric layer 26. As such, the bottom surface of the first device layer 24 is a bottom surface of the SOI die 12D, and the backside of the first silicon substrate 74 is a top surface of the SOI die 12D. Herein, the SOI die 12D is formed from an SOI structure, which refers to a structure including a silicon substrate, a silicon epitaxy layer, and a buried oxide layer sandwiched between the silicon substrate and the silicon epitaxy layer. The first device layer 24 of the SOI die 12D is formed by integrating electronic components (not shown) in or on the silicon epitaxy layer of the SOI structure. The first dielectric layer 26 of the SOI die 12D is the buried oxide layer of the SOI structure. The first silicon substrate 74 of the SOI die 12D is the silicon substrate of the SOI structure. The SOI die 12D has a thickness between 25 μm and 250 μm or between 25 µm and 750 µm, and the first silicon substrate 74 has a thickness between 25 µm and 250 µm or between 25 µm and 750 µm, respectively.

The MEMS die 14D includes the second device layer 30, the second dielectric layer 32 over the top surface of the second device layer 30, and a second silicon substrate 76 over the second dielectric layer 32. As such, the bottom surface of the second device layer 30 is a bottom surface of the MEMS die 14D, and the backside of the second silicon substrate is a top surface of the MEMS die 14D. The MEMS die 14D has a thickness between 50 µm and 300 µm or between 50 µm and 800 µm, and the second silicon substrate 76 has a thickness between 50 µm and 250 µm or between 50 µm and 750 µm, respectively. In this embodiment, both the SOI die 12D and the MEMS die 14D are taller than the CMOS controller die 16. If there are only the MEMS die 14D and the CMOS controller die 16 attached to the adhesive layer 70, the CMOS controller die 16 is just shorter than the MEMS die 14D.

Figure 5:
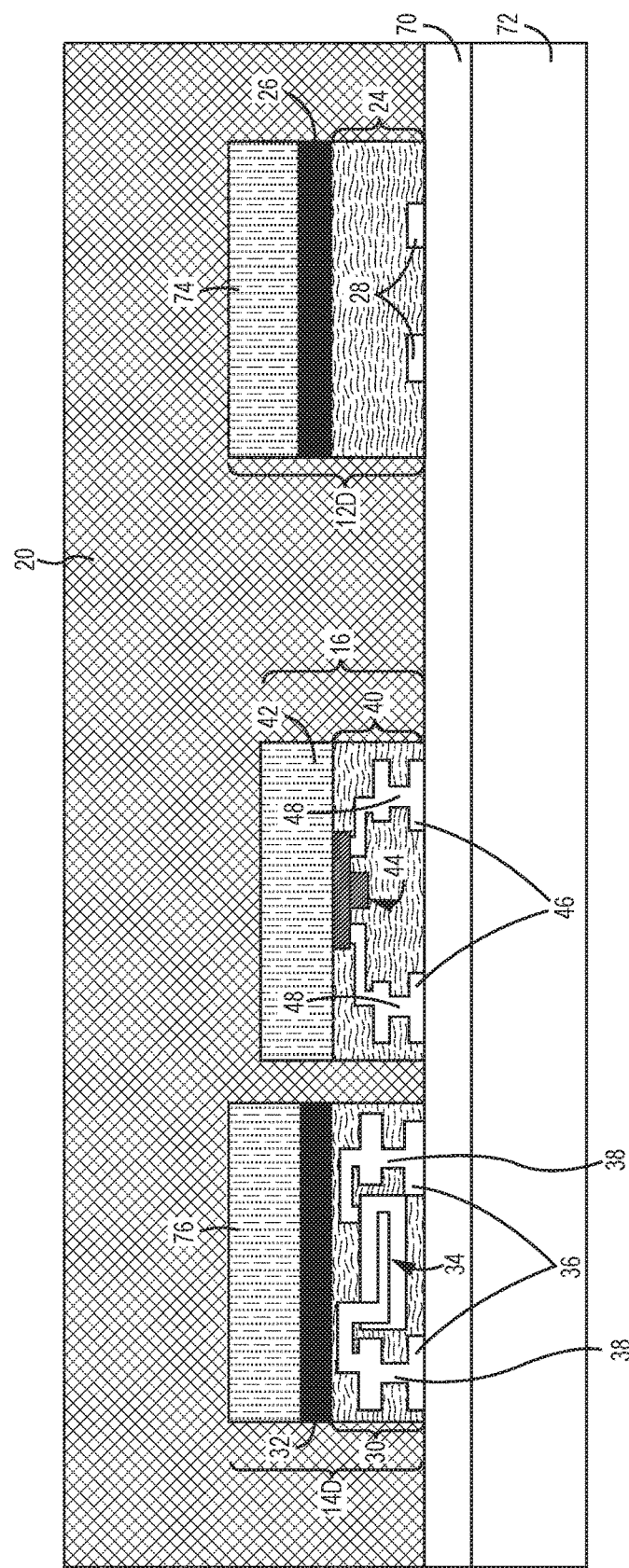
Figure 6:
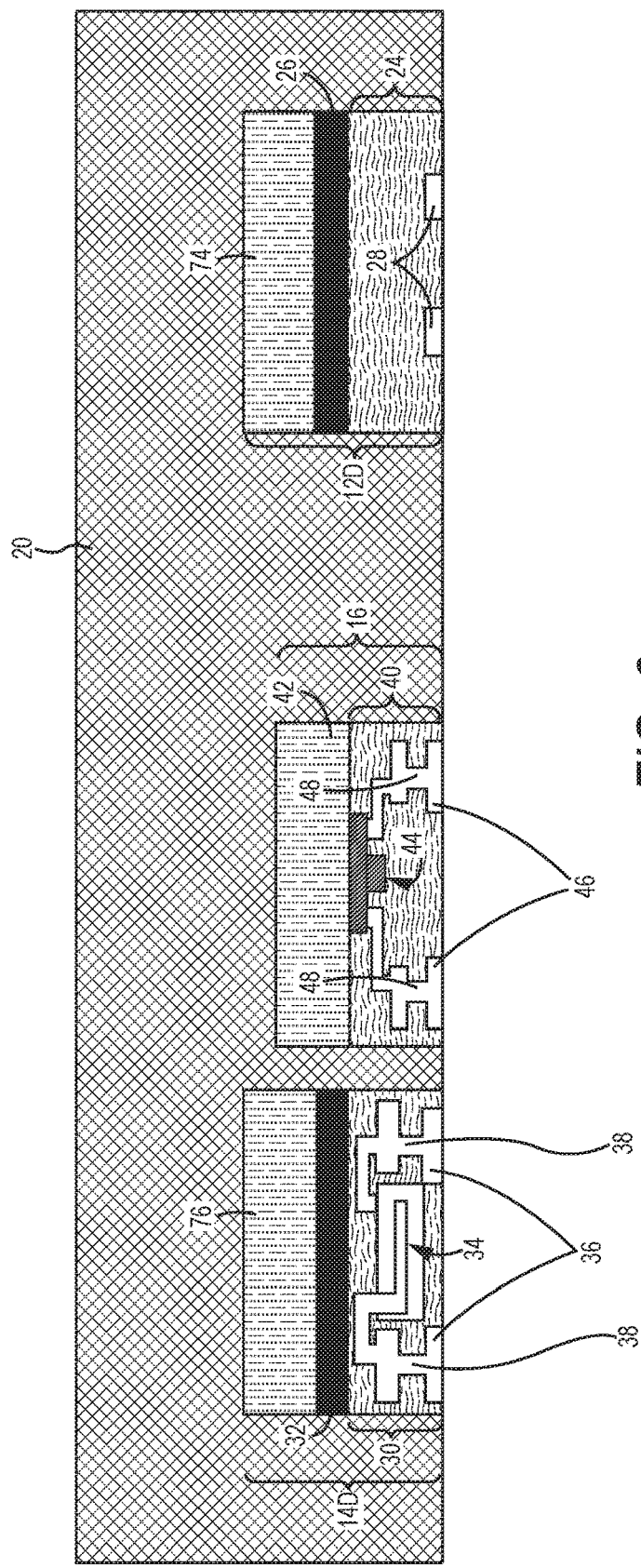

Next, the first mold compound 20 is applied over the adhesive layer 70 to encapsulate the SOI die 12D, the MEMS die 14D, and the CMOS controller die 16 as illustrated in FIG. 5. The first mold compound 20 may be applied by various procedures, such as sheet molding, overmolding, compression molding, transfer molding, dam fill encapsulation, or screen print encapsulation. The first mold compound 20 may be an organic epoxy resin system or the like, which can be used as an etchant barrier to protect the SOI die 12D, the MEMS die 14D, and the CMOS controller die 16 against etching chemistries such as potassium hydroxide (KOH), sodium hydroxide (NaOH), and acetylcholine (ACH). A curing process (not shown) is then used to harden the first mold compound 20. The curing temperature is between 100° C. and 320° C. depending on which material is used as the first mold compound 20. The adhesive layer 70 and the carrier 72 are then removed to expose the bottom surface of the first device layer 24, the bottom surface of the second device layer 30, and the bottom surface of the third device layer 40 as shown in FIG. 6. Removal of the adhesive layer 70 and the carrier 72 may be provided by heating the adhesive layer 70.

Figure 7:
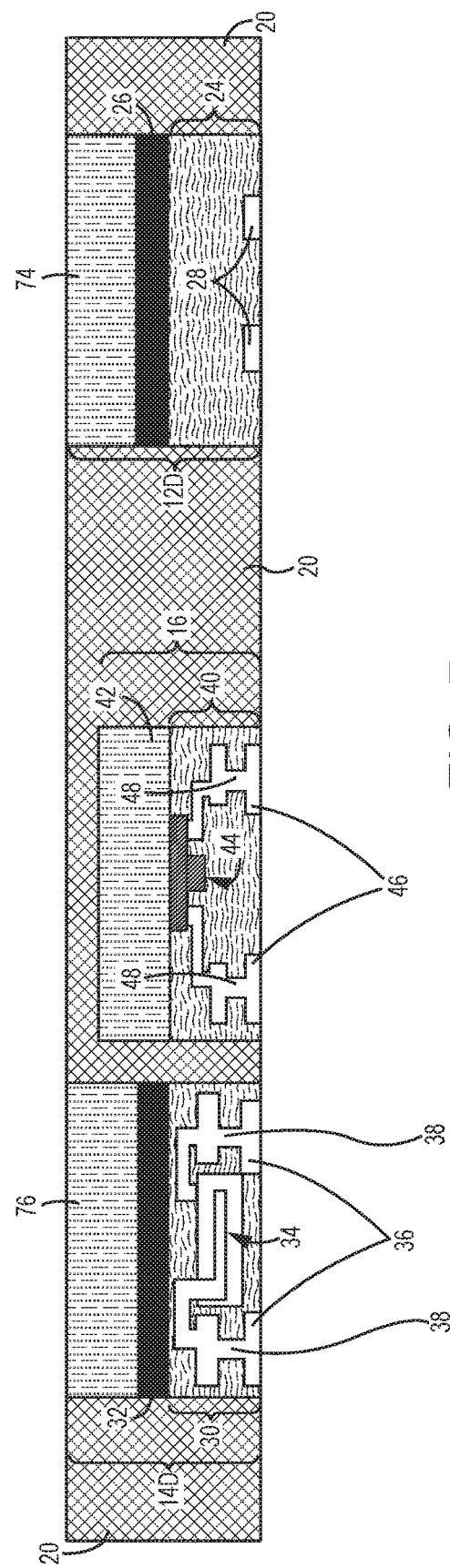

The first mold compound 20 is then thinned down to expose the first silicon substrate 74 of the SOI die 12D and the second silicon substrate 76 of the MEMS die 14D as shown in FIG. 7. The thinning procedure may be done with a mechanical grinding process. Since the CMOS controller die 16 has a lower height than both the MEMS die 14D and the SOI die 12D, the silicon substrate 42 of the CMOS controller die 16 is not exposed and still encapsulated by the first mold compound 20.

Figure 8:
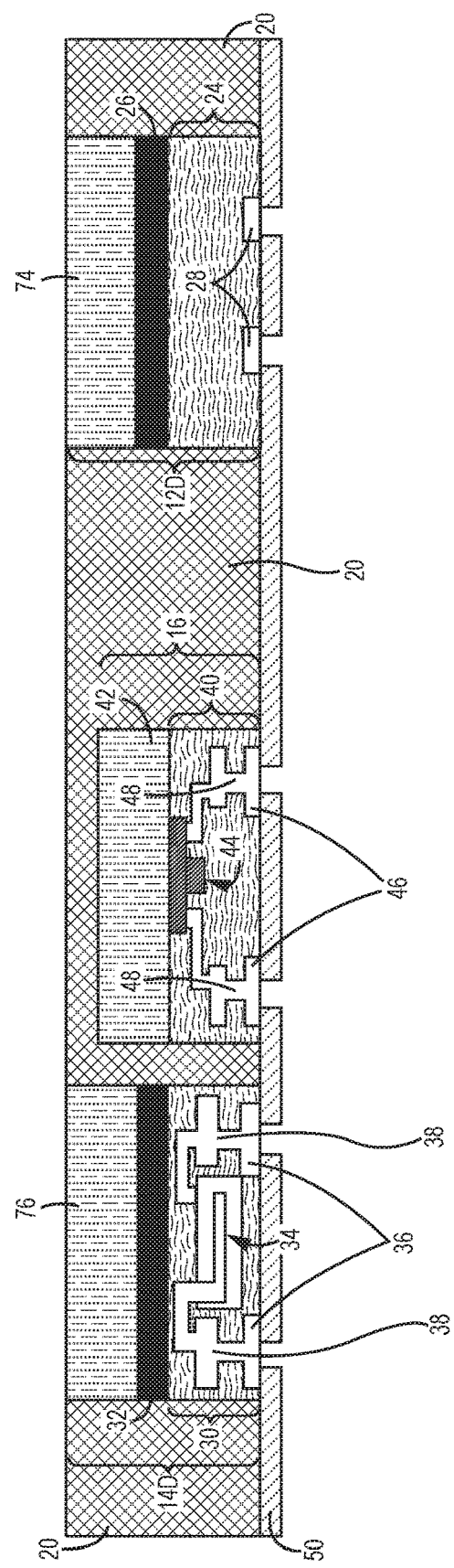
Figure 9:
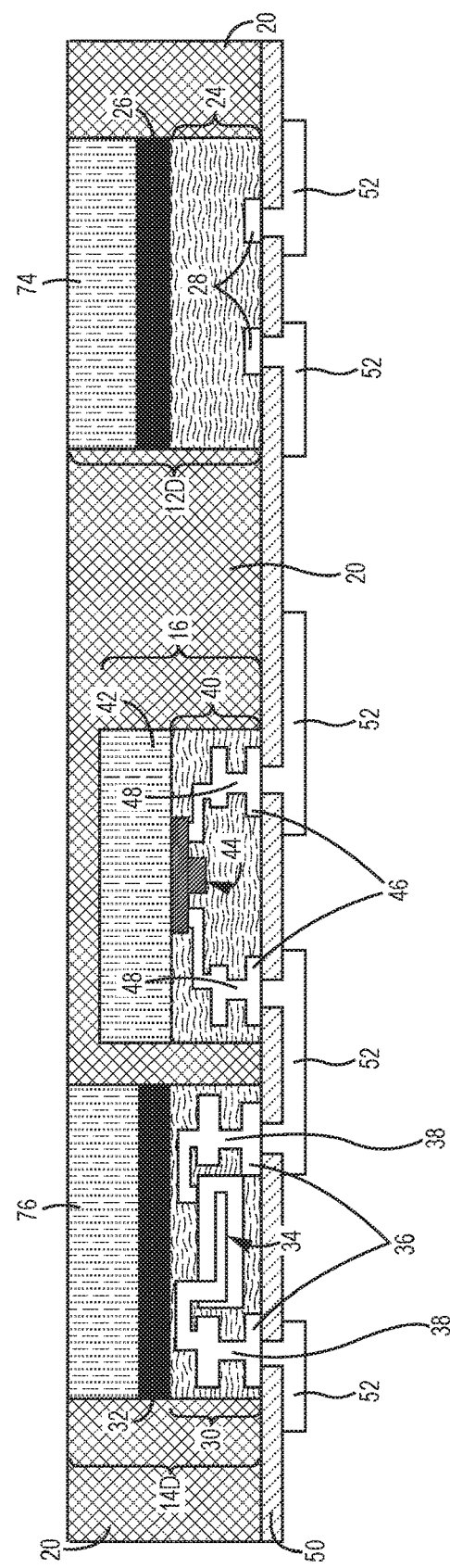

With reference to FIGS. 8 through 11, the multilayer redistribution structure 18 is formed according to one embodiment of the present disclosure. The first dielectric pattern 50 is firstly formed underneath the SOI die 12D, the MEMS die 14D, and the CMOS controller die 16, as illustrated in FIG. 8. As such, the first, second, and third die contacts 28, 36, and 46 are exposed through the first dielectric pattern 50. Next, the redistribution interconnects 52 are formed as illustrated in FIG. 9. The redistribution interconnects 52 are electrically coupled to the first, second, and third die contacts 28, 36, and 46 through the first dielectric pattern 50 and extend underneath the first dielectric pattern 50. Notice that the connections between the redistribution interconnects 52 and the first, second, and third die contacts 28, 36, and 46 are solder-free.

Figure 10:
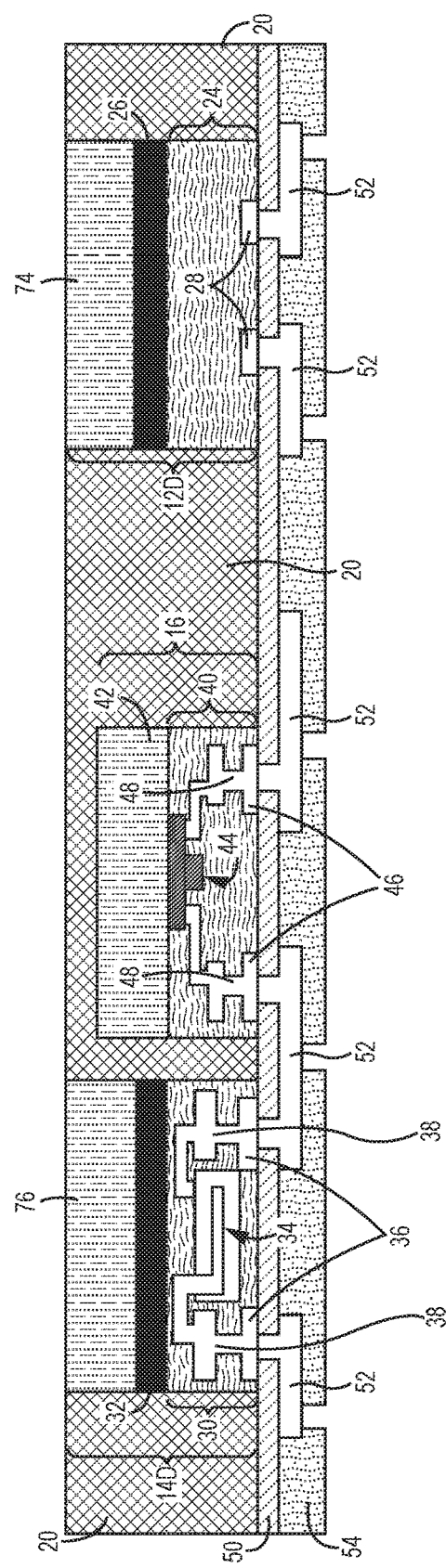
Figure 11:
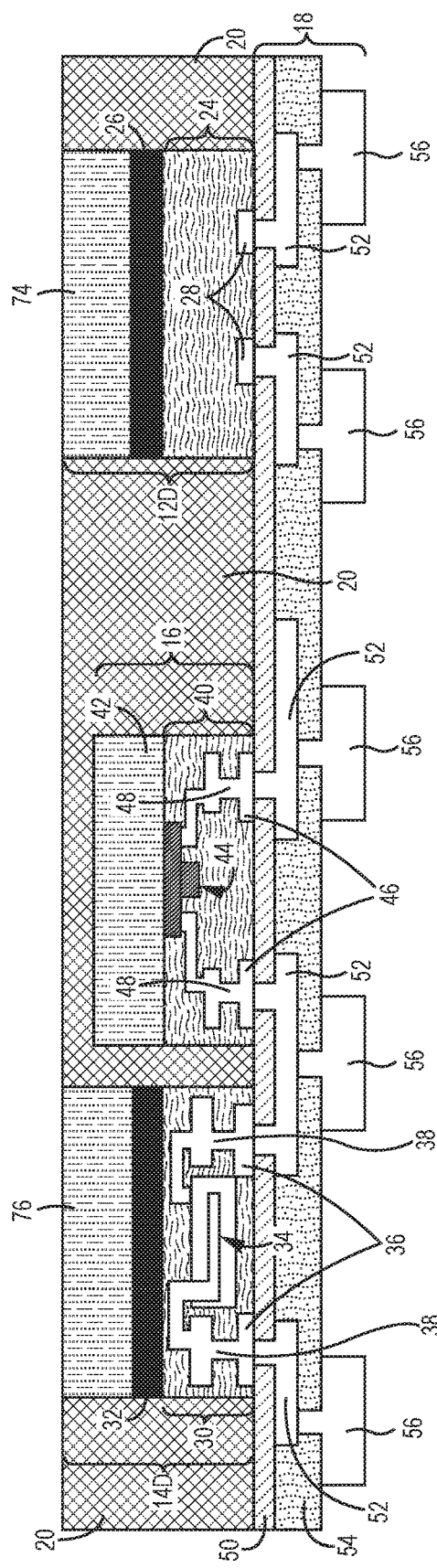

The second dielectric pattern 54 is formed underneath the first dielectric pattern 50 to partially encapsulate each redistribution interconnect 52 as illustrated in FIG. 10. As such, a portion of each redistribution interconnect 52 is exposed through the second dielectric pattern 54. Lastly, the package contacts 56 are applied to exposed portions of the redistribution interconnects 52 as illustrated in FIG. 11. The package contacts 56 may be applied by a standard bumping procedure or a land grid arrays process. Herein, the redistribution interconnects 52 connect certain ones of the first, second, and third die contacts 28, 36, and 46 to certain ones of the package contacts 56 on a bottom surface of the multilayer redistribution structure 18.

Figure 12:
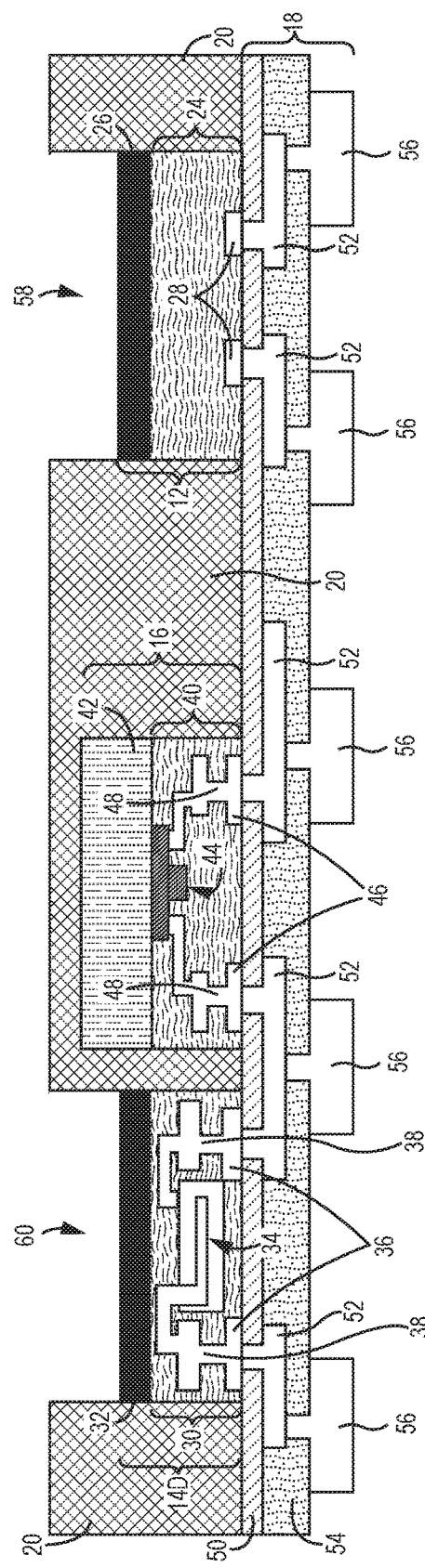

After the multilayer redistribution structure 18 is formed, the first silicon substrate 74 and the second silicon substrate 76 are removed substantially as illustrated in FIG. 12. The removal of the first silicon substrate 74 from the SOI die 12D provides the thinned SOI die 12 and forms the first opening 58 within the first mold compound 20 and over the thinned SOI die 12. The removal of the second silicon substrate 76 from the MEMS die 14D provides the thinned MEMS die 14 and forms the second opening 60 within the first mold compound 20 and over the thinned MEMS die 14. Herein, removing substantially a silicon substrate refers to removing at least 95% of the entire silicon substrate and remaining at most 2 µm silicon substrate. In desired cases, the first and second silicon substrates 74 and 76 are removed completely, such that the first dielectric layer 26 of the thinned SOI die 12 is exposed at the bottom of the first opening 58 and the second dielectric layer 32 of the thinned MEMS die 14 is exposed at the bottom of the second opening 60. Removing substantially the first and second silicon substrates 74 and 76 may be provided by an etching process with a wet/dry etchant chemistry, which may be TMAH, KOH, ACH, NaOH, or the like.

Figure 13:
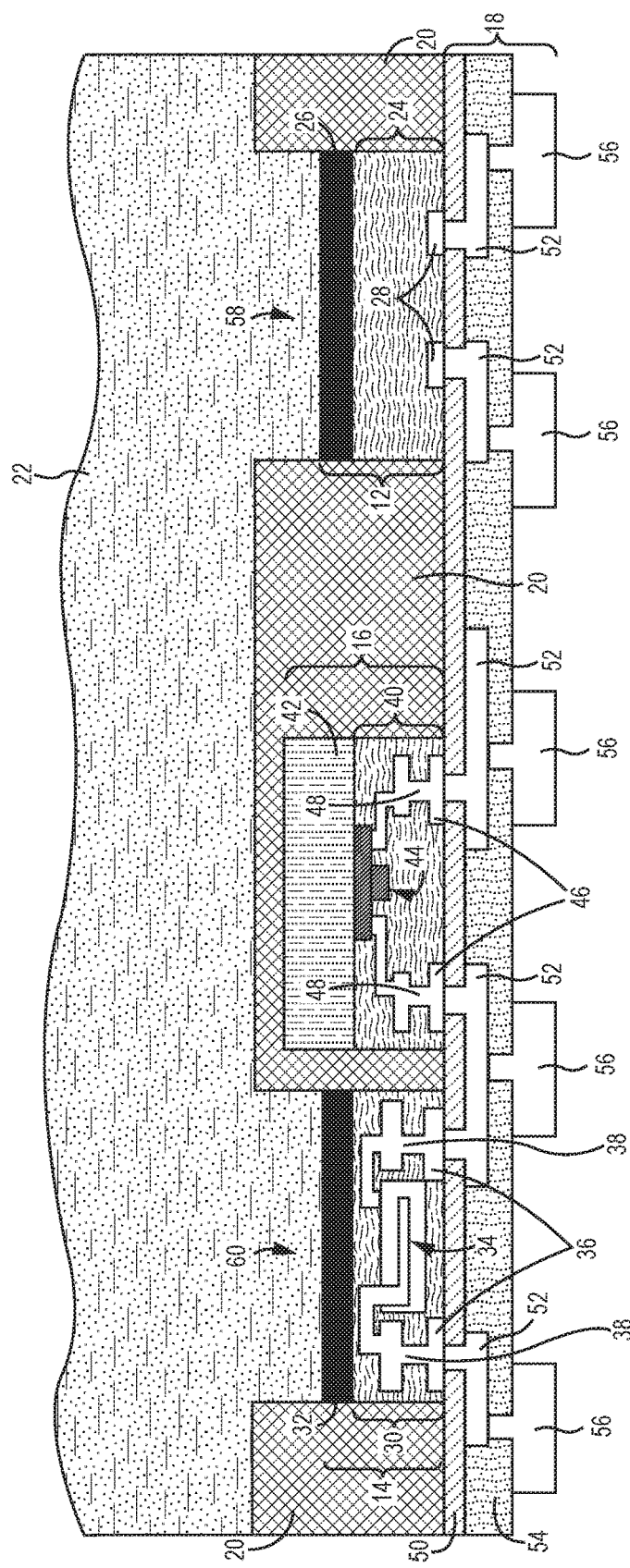

The second mold compound 22 is then applied to substantially fill the first and second openings 58 and 60, as illustrated in FIG. 13. The second mold compound 22 may be applied by various procedures, such as sheet molding, overmolding, compression molding, transfer molding, dam fill encapsulation, and screen print encapsulation. The second mold compound 22 directly resides over the top surface of the thinned SOI die 12 and the top surface of the thinned MEMS die 14. If there is no first silicon substrate 74 left in the first opening 58 and no second silicon substrate 76 left in the second opening 60, the second mold compound 22 directly resides over the first dielectric layer 26 and the second dielectric layer 32. In some cases, the second mold compound 22 may further reside over the first mold compound 20. A curing process (not shown) is followed to harden the second mold compound 22. The curing temperature is between 100° C. and 320° C. depending on which material is used as the second mold compound 22.

Figure 14:
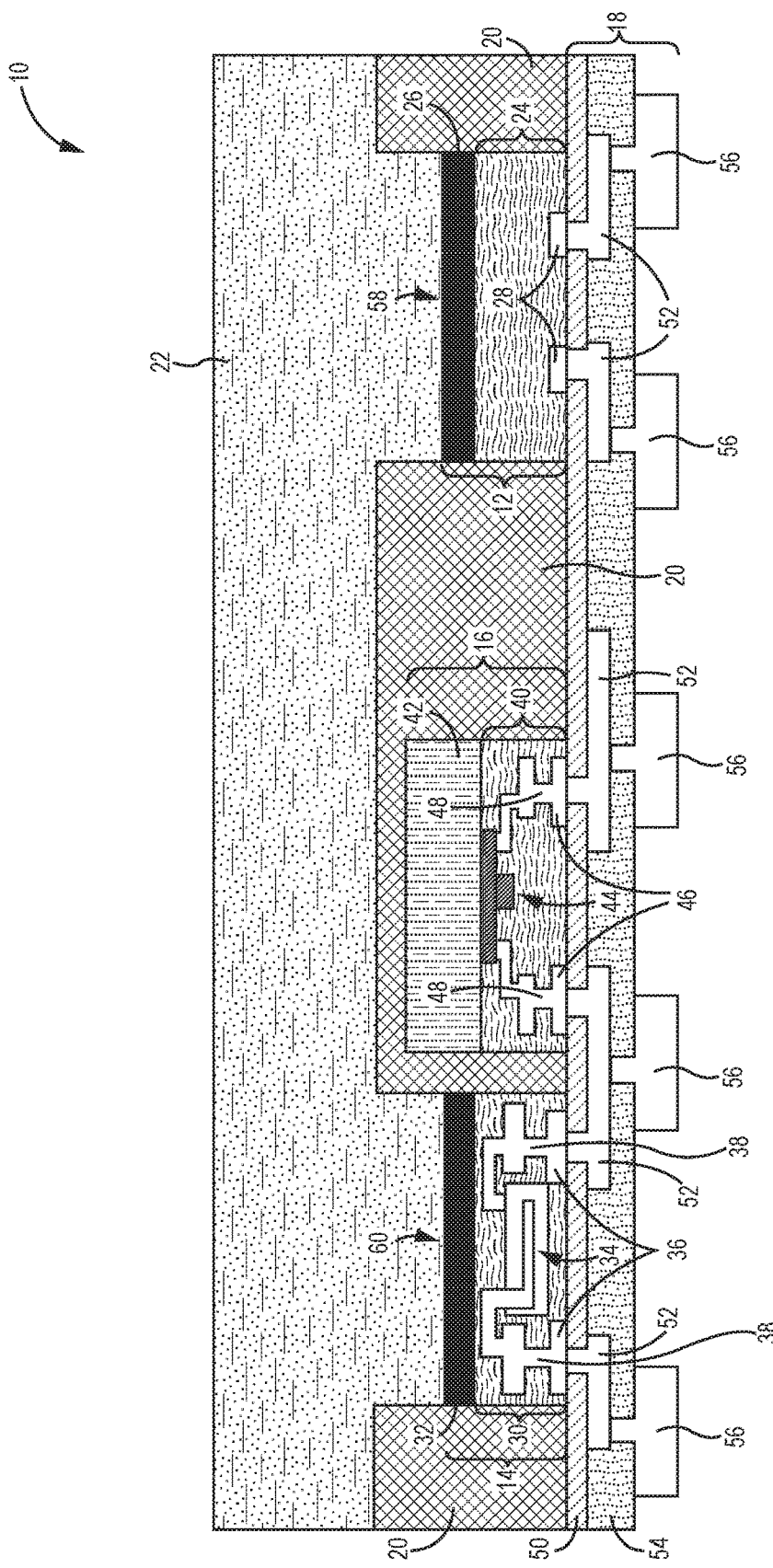

A top surface of the second mold compound 22 is then planarized to form the wafer-level package 10 as illustrated in FIG. 14. A mechanical grinding process may be used for planarization. Lastly, the wafer-level semiconductor package 10 may be marked, diced, and singulated into individual components (now shown).

Those skilled in the art will recognize improvements and modifications to the preferred embodiments of the present disclosure. All such improvements and modifications are considered within the scope of the concepts disclosed herein and the claims that follow.

What is claimed is:
1. An apparatus comprising:
   a first thinned die comprising a first device layer and a first dielectric layer directly over the first device layer, wherein:

the first device layer comprises a plurality of first die contacts at a bottom surface of the first device layer;
a top surface of the first dielectric layer is a top surface of the first thinned die; and
the first dielectric layer has a thickness between 10 nm and 1000 nm;
a multilayer redistribution structure comprising a plurality of package contacts on a bottom surface of the multilayer redistribution structure and redistribution interconnects that connect the plurality of first die contacts to certain ones of the plurality of package contacts, wherein the multilayer redistribution structure is free of glass fiber and connections between the redistribution interconnects and the plurality of first die contacts are solder-free;
a first mold compound residing over the multilayer redistribution structure and around the first thinned die, and extending beyond the top surface of the first thinned die to define an opening within the first mold compound and over the first thinned die, wherein the top surface of the first dielectric layer is exposed at a bottom of the opening; and
a second mold compound filling the opening and directly over the top surface of the first dielectric layer.

2. The apparatus of claim 1, wherein the first thinned die provides a microelectromechanical systems (MEMS) component.

3. The apparatus of claim 1, wherein the first thinned die is formed from a silicon-on-insulator (SOI) structure, wherein the first device layer of the first thinned die is formed from a silicon epitaxy layer of the SOI structure, and the first dielectric layer of the first thinned die is a buried oxide layer of the SOI structure.

4. The apparatus of claim 1, wherein the second mold compound has a thermal conductivity greater than 2 W/m·K.

5. The apparatus of claim 1, wherein the second mold compound has a thermal conductivity greater than 10 W/m·K.

6. The apparatus of claim 1, wherein the second mold compound has an electrical resistivity greater than 1E6 Ohm·cm.

7. The apparatus of claim 1, wherein the first mold compound is formed from a same material as the second mold compound.

8. The apparatus of claim 7, wherein the first mold compound and the second mold compound have a thermal conductivity greater than 2 W/m·K.

9. The apparatus of claim 1, wherein the first mold compound and the second mold compound are formed from different materials.

10. The apparatus of claim 9, wherein the first mold compound has a thermal conductivity greater than 2 W/m·K and the second mold compound has a thermal conductivity greater than 10 W/m-K.

11. The apparatus of claim 1, wherein the bottom surface of the first device layer is in contact with the multilayer redistribution structure, and the plurality of first die contacts are directly connected to the redistribution interconnects.

12. The apparatus of claim 1, wherein the first thinned die further comprises a plurality of first pillars, wherein each of the plurality of first pillars extends from the first device layer to the multilayer redistribution structure and couples one of the plurality of first die contacts to a corresponding redistribution interconnect.

13. The apparatus of claim 12 further comprising an underfilling layer that resides between the multilayer redistribution structure and the first mold compound, and underfills the first thinned die to encapsulate the plurality of first pillars.

14. The apparatus of claim 13 wherein the underfilling layer is formed from a same material as the first mold compound.

15. The apparatus of claim 14, wherein the first mold compound and the underfilling layer have a thermal conductivity greater than 2 W/m-K.

16. The apparatus of claim 1, wherein the first dielectric layer is formed from one of a group consisting of silicon oxide, silicon nitride, and aluminum nitride.

17. The apparatus of claim 1, wherein the plurality of package contacts are bump contacts or land grid arrays (LGA) contacts.

18. The apparatus of claim 1, wherein the multilayer redistribution structure is glass-free.

19. An apparatus comprising:
a first thinned die comprising a first device layer and a first dielectric layer over the first device layer, wherein the first device layer comprises a plurality of first die contacts at a bottom surface of the first device layer;
a multilayer redistribution structure comprising a plurality of package contacts on a bottom surface of the multilayer redistribution structure and redistribution interconnects that connect the plurality of first die contacts to certain ones of the plurality of package contacts, wherein the multilayer redistribution structure is free of glass fiber and connections between the redistribution interconnects and the plurality of first die contacts are solder-free;
a first mold compound residing over the multilayer redistribution structure and around the first thinned die, and extending beyond a top surface of the first thinned die to define an opening within the first mold compound and over the first thinned die, wherein the top surface of the first thinned die is exposed at a bottom of the opening;
a second mold compound filling the opening and in contact with the top surface of the first thinned die; and
a second intact die residing over the multilayer redistribution structure, wherein:
the second intact die has a second device layer and an intact silicon substrate over the second device layer; and
the first mold compound encapsulates the second intact die.

20. The apparatus of claim 19, wherein the first thinned die provides a MEMS component and the second intact die provides a complementary metal-oxide-semiconductor (CMOS) controller that controls the MEMS component.

21. The apparatus of claim 19 further comprising a third thinned die residing over the multilayer redistribution structure, wherein:
the third thinned die has a third device layer and a second dielectric layer over the third device layer;
the first mold compound extends beyond a top surface of the third thinned die to define a second opening within the first mold compound and over the third thinned die, wherein the top surface of the third thinned die is exposed at a bottom of the second opening; and
the second mold compound fills the second opening and in contact with the top surface of the third thinned die.

22. The apparatus of claim 21, wherein the first thinned die provides a MEMS component, the second intact die provides a CMOS controller that controls the MEMS component, and the third thinned die is formed from a SOI structure, wherein the third device layer of the third thinned die is formed from a silicon epitaxy layer of the SOI structure, and the second dielectric layer of the third thinned die is a buried oxide layer of the SOI structure.

* * * * *